US009847161B2

(12) United States Patent
Ohmori et al.

(10) Patent No.: US 9,847,161 B2
(45) Date of Patent: *Dec. 19, 2017

(54) MULTILAYER MAGNETIC STORAGE ELEMENT AND STORAGE DEVICE

(71) Applicant: Sony Corporation, Tokyo (JP)

(72) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Hiroyuki Uchida, Kanagawa (JP); Tetsuya Asayama, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/805,015

(22) Filed: Jul. 21, 2015

(65) Prior Publication Data

US 2015/0325782 A1 Nov. 12, 2015

Related U.S. Application Data

(63) Continuation of application No. 13/451,043, filed on Apr. 19, 2012, now Pat. No. 9,093,211.

(30) Foreign Application Priority Data

May 10, 2011 (JP) .................. 2011-104877

(51) Int. Cl.
*H01F 10/32* (2006.01)
*H01L 43/02* (2006.01)
(Continued)

(52) U.S. Cl.
CPC .......... *H01F 10/3286* (2013.01); *B82Y 40/00* (2013.01); *G11C 11/161* (2013.01);
(Continued)

(58) Field of Classification Search
CPC .. H01F 10/3286; H01F 10/329; H01F 41/303; H01F 10/3254; H01F 41/325;
(Continued)

(56) References Cited

U.S. PATENT DOCUMENTS 8,084,835 B2 * 12/2011 Ranjan .................. B82Y 10/00
257/421
9,093,211 B2 * 7/2015 Ohmori ................. H01L 27/226
(Continued)

FOREIGN PATENT DOCUMENTS

JP 2004-193595 7/2004
JP 2009-081215 4/2009

OTHER PUBLICATIONS

Ikeda, et al., "A perpendicular-anisotropy CoFeB—MgO magnetic tunnel junction," Nature Materials, vol. 9., Sep. 2010, pp. 721-724, also published online Jul. 11, 2010, www.nature.com/naturematerials. (4 pages).

*Primary Examiner* — J. H. Hur
(74) *Attorney, Agent, or Firm* — K&L Gates LLP

(57) ABSTRACT

A storage element includes a storage layer having a magnetization perpendicular to a layer surface and storing information according to a magnetization state of a magnetic material; a fixed magnetization layer having the magnetization as a reference of the information of the storage layer and perpendicular to the layer surface; an interlayer formed of a nonmagnetic material and interposed between the storage layer and the fixed magnetization layer; a coercive force enhancement layer adjacent to the storage layer, opposite to the interlayer, and formed of Cr, Ru, W, Si, or Mn; and a spin barrier layer formed of an oxide, adjacent to the coercive force enhancement layer, and opposite to the storage layer. The storage layer magnetization is reversed using spin torque magnetization reversal caused by a current in a (Continued)

lamination direction of a layer structure including the storage layer, the interlayer, and the fixed magnetization layer, thereby storing information.

19 Claims, 8 Drawing Sheets

(51) Int. Cl.

| | |
|---|---|
| *H01L 43/10* | (2006.01) |
| *G11C 11/16* | (2006.01) |
| *H01L 43/08* | (2006.01) |
| *H01L 27/22* | (2006.01) |
| *H01F 41/30* | (2006.01) |
| *B82Y 40/00* | (2011.01) |
| *H01F 41/32* | (2006.01) |

(52) U.S. Cl.
CPC ........ *G11C 11/1675* (2013.01); *H01F 10/329* (2013.01); *H01F 41/303* (2013.01); *H01L 27/226* (2013.01); *H01L 43/02* (2013.01); *H01L 43/08* (2013.01); *H01L 43/10* (2013.01); *H01F 10/3254* (2013.01); *H01F 41/325* (2013.01)

(58) Field of Classification Search
CPC ....... H01L 43/10; H01L 43/02; H01L 27/226; H01L 43/08; B82Y 40/00; G11C 11/1675; G11C 11/161

See application file for complete search history.

(56) References Cited

U.S. PATENT DOCUMENTS

| | | | |
|---|---|---|---|
| 2008/0096055 | A1 | 4/2008 | Takenoiri et al. |
| 2010/0078742 | A1* | 4/2010 | Zheng ............... H01L 29/82 257/421 |
| 2010/0080036 | A1 | 4/2010 | Liu et al. |
| 2010/0271870 | A1* | 10/2010 | Zheng ............... B82Y 25/00 365/171 |
| 2011/0133299 | A1* | 6/2011 | Zhu ............... H01L 43/08 257/421 |
| 2012/0104522 | A1* | 5/2012 | Jung ............... H01F 10/3254 257/421 |
| 2012/0280336 | A1* | 11/2012 | Jan ............... H01L 43/08 257/421 |

* cited by examiner

| 20 | Ru: 3 nm |
| 19 | MgO: 0.6 nm |
| 18 | Cr: $t_{Cr}$ (nm) |
| 17 | $Fe_{64}Co_{16}B_{20}$: $t_{FeCoB}$ (nm) |
| 16 | MgO: 0.8 nm |
| 15 | $Fe_{64}Co_{16}B_{20}$: 0.8 nm |
| 13 | Ru: 0.9 nm |
| 12 | CoPt: 2 nm |
| 14 | Ru: 5 nm |
|    | Ta: 5 nm |

FIG. 7A

| | |
|---|---|
| 20 | Ru: 3 nm |
| 19 | SPIN BARRIER LAYER FORMED OF EACH MATERIAL |
| 18 | Cr: 0.2 nm |
| 17 | $Fe_{40}Co_{40}C_{20}$: 0.7 nm |
| 14 | Ta: 5 nm |

FIG. 7B

| SPIN BARRIER LAYER | $Hc\perp$ (Oe) |
|---|---|
| RF SPUTTERED MgO | 89 |
| NATURALLY OXIDIZED Mg | 112 |
| RF SPUTTERED $Al_2O_3$ | 46 |
| NATURALLY OXIDIZED Al | 65 |
| RF SPUTTERED BaO | 103 |
| RF SPUTTERED CaO | 122 |
| RF SPUTTERED $CrO_2$ | 93 |
| RF SPUTTERED $Cr_2O_3$ | 57 |

FIG. 7C

| SPIN BARRIER LAYER |
|---|
| RF SPUTTERED ZnO |
| RF SPUTTERED NiO |
| RF SPUTTERED $SiO_2$ |
| RF SPUTTERED TiO |

FIG. 8

SAMPLE A (COMPARATIVE EXAMPLE)

| Layer | Material |
|---|---|
| 20 | Ru: 3 nm |
| 19 | MgO: 0.6 nm |
| 17 | $Fe_{64}Co_{16}B_{20}$: 1.2 nm |
| 16 | MgO: 0.8 nm |
| 15 | $Fe_{64}Co_{16}B_{20}$: 0.8 nm |
| 13 | Ru: 0.8 nm |
| 12 | CoPt: 2 nm |
| 14 { | Ru: 5 nm |
|  | Ta: 5 nm |

⇨ $K_UV/k_BT = 35$

SAMPLE B (EMBODIMENT)

| Layer | Material |
|---|---|
| 20 | Ru: 3 nm |
| 19 | MgO: 0.6 nm |
| 18 | Cr: 0.2 nm |
| 17 | $Fe_{64}Co_{16}B_{20}$: 1.6 nm |
| 16 | MgO: 0.8 nm |
| 15 | $Fe_{64}Co_{16}B_{20}$: 0.8 nm |
| 13 | Ru: 0.8 nm |
| 12 | CoPt: 2 nm |
| 14 { | Ru: 5 nm |
|  | Ta: 5 nm |

⇨ $K_UV/k_BT = 76$

SAMPLE C (EMBODIMENT)

| Layer | Material |
|---|---|
| 20 | Ru: 3 nm |
| 19 | CaO: 0.6 nm |
| 18 | Ru: 0.05 nm |
| 17 | $Fe_{50}Ni_{30}C_{20}$: 1.5 nm |
| 16 | MgO: 0.8 nm |
| 15 | $Fe_{64}Co_{16}B_{20}$: 0.8 nm |
| 13 | Ru: 0.8 nm |
| 12 | CoPt: 2 nm |
| 14 { | Ru: 5 nm |
|  | Ta: 5 nm |

⇨ $K_UV/k_BT = 68$

MULTILAYER MAGNETIC STORAGE ELEMENT AND STORAGE DEVICE

CROSS REFERENCES TO RELATED APPLICATIONS

The present application is a continuation of U.S. patent application Ser. No. 13/451,043, filed on Apr. 19, 2012, which claims priority to Japanese Priority Patent Application JP 2011-104877 filed in the Japan Patent Office on May 10, 2011, the entire content of which is hereby incorporated by reference.

BACKGROUND

The present disclosure relates to a storage element and a storage device incorporating the storage element. The storage element includes a storage layer which stores a magnetization state of a ferromagnetic layer as information and a fixed magnetization layer in which a magnetization direction is fixed, and changes the magnetization direction of the storage layer by the flow of an electric current.

In information equipment such as a computer, as random access memory, DRAM (Dynamic Random Access Memory) which rapidly operates and is high-density has been widely used. However, since DRAM is a volatile memory which loses information when the power is turned off, a nonvolatile memory which does not lose information when the power is turned off has been anticipated.

As a candidate for nonvolatile memory, magnetic random access memory (MRAM) which stores information on the basis of the magnetization of a magnetic material has attracted attention and been studied. As a method of performing data storing in MRAM, for example, Japanese Unexamined Patent Application Publication No. 2004-193595 discloses a storage element using a spin torque magnetization reversal in which magnetization of a magnetic material which performs storage is reversed by a spin torque flowing between two magnetic materials. This element has attracted attention due to a relatively simple structure and a large number of rewritable times.

Similar to MRAM, a storage element using the spin torque magnetization reversal is configured a MTJ (Magnetic Tunnel Junction) in many cases. This configuration uses a phenomenon that, when spin polarized electrons which pass through a magnetic layer fixed to a given direction enter another free magnetic layer (where a direction is not fixed), a torque is applied to the magnetic layer (this phenomenon is also referred to as a spin transfer torque). In this case, when a current equal to or more than a given threshold is made to flow, the free magnetic layer is reversed. 0 and 1 are rewritten by changing a polarity of a current.

An absolute value of a current for the reversal is equal to or less than 1 mA for an element in the scale of about 0.1 μm. In addition, since this current value is reduced in proportion to the element volume, scaling is possible. Furthermore, since a word line which is necessary for generating the recording current magnetic field in MRAM is not necessary, there is also an advantageous effect in that a cell structure is simple.

Hereinafter, MRAM using the spin torque magnetization reversal is referred to as "a spin torque MRAM" or "ST-MRAM (Spin Torque-Magnetic Random Access Memory). The spin torque magnetization reversal may be sometimes referred to as a spin injection magnetization reversal.

As examples of ST-MRAM, there is ST-MRAM using an in-plane magnetization as disclosed in Japanese Unexamined Patent Application Publication No. 2004-193595 and ST-MRAM using a perpendicular magnetization as disclosed in Japanese Unexamined Patent Application Publication No. 2009-81215.

In ST-MRAM using the in-plane magnetization, a material can be selected with high degrees of freedom and a method of fixing the magnetization is relatively easy. However, in the case of the perpendicular magnetic layer, the material is limited to a material having a perpendicular magnetic anisotropy.

Recently, as disclosed in Nature Materials, Vol. 9, p. 721 (2010), for example, an interface anisotropy-type perpendicular magnetic layer using the perpendicular magnetic anisotropy which is developed at the crystal interface between Fe and an oxide has attracted attention.

When the interface anisotropy is used, the perpendicular magnetic layer can be obtained by a FeCoB alloy as the magnetic material and MgO as the oxide and thereby the trade-off between a high magnetoresistance ratio (MR ratio) and the perpendicular magnetization can be realized. Since the interface anisotropy acts favorable for both of the storage layer and a reference layer, the application to the perpendicular magnetization-type spin torque MRAM is expected.

SUMMARY

In order to increase the density of a magnetic memory, the storage element should have large anisotropy energy with respect to thermal fluctuation.

In order to increase the anisotropy energy, it is effective to increase coercive force and increase the thickness of the storage layer. However, the interface anisotropy as the perpendicular magnetic anisotropy can be obtained only at the interface between the magnetic material and the oxide. Therefore, when the thickness of the magnetic layer is increased, the coercive force is reduced. As a result, it is difficult to easily increase the anisotropy energy.

It is desirable to realize a nonvolatile memory which has large anisotropy energy in spin torque MRAM and a sufficient resistance to the thermal fluctuation even when the element is reduced in size.

According to an embodiment of the present disclosure, there is provided a storage element including: a storage layer that has a magnetization perpendicular to a surface of the layer and stores information on the basis of a magnetization state of a magnetic material; a fixed magnetization layer that has the magnetization serving as a reference of the information stored in the storage layer and being perpendicular to the surface of the layer; an interlayer that is formed of a nonmagnetic material and interposed between the storage layer and the fixed magnetization layer; a coercive force enhancement layer that is provided to be adjacent to the storage layer and opposite to the interlayer and is formed of at least one of Cr, Ru, W, Si, and Mn; and a spin barrier layer that is formed of an oxide and provided to be adjacent to the coercive force enhancement layer and opposite to the storage layer. In this case, the magnetization of the storage layer is reversed using a spin torque magnetization reversal which is caused by a current flowing in a lamination direction of a layer structure including the storage layer, the interlayer, and the fixed magnetization layer, thereby storing information.

According to another embodiment of the present disclosure, there is provided a storage device including: a storage element that stores information on the basis of a magnetization state of a magnetic material; and two types of interconnects intersecting with each other. The storage element includes a storage layer that has a magnetization perpendicular to a surface of the layer and stores information on the basis of a magnetization state of a magnetic material, a fixed magnetization layer that has the magnetization serving as a reference of the information stored in the storage layer and being perpendicular to the surface of the layer, an interlayer that is formed of a nonmagnetic material and interposed between the storage layer and the fixed magnetization layer, a coercive force enhancement layer that is provided to be adjacent to the storage layer and opposite to the interlayer and is formed of at least one of Cr, Ru, W, Si, and Mn, and a spin barrier layer that is formed of an oxide and provided to be adjacent to the coercive force enhancement layer and opposite to the storage layer, in which the magnetization of the storage layer is reversed using a spin torque magnetization reversal which is caused by a current flowing in a lamination direction of a layer structure including the storage layer, the interlayer, and the fixed magnetization layer, thereby storing information. In addition, the storage element is disposed between the two types of interconnects, and the current in the lamination direction is made to flow in the storage element through the two types of interconnects, thereby causing the spin torque magnetization reversal.

According to the embodiment of the present disclosure, as the ST-MRAM, an MTJ structure in which the storage layer, the interlayer (tunnel barrier layer), and the fixed magnetization layer are laminated, is employed. In addition, the coercive force enhancement layer formed of at least one of Cr, Ru, W, Si, and Mn is provided to be adjacent to the storage layer, and the spin barrier layer formed of the oxide is provided to be adjacent to the coercive force enhancement layer. By providing the coercive force enhancement layer, the coercive force of the storage layer can be increased thus to increase the anisotropy energy. Accordingly, a nonvolatile memory which has a sufficient resistance to the thermal fluctuation even when the element is reduced in size can be realized.

According to the embodiments of the present disclosure, as a nonvolatile memory using the perpendicular magnetic ST-MRAM, an element which has sufficient magnetic anisotropy energy even when the element is reduced in size can be obtained. As a result, a storage element and a storage device which have an excellent capability of storing information with high density can be realized.

Additional features and advantages are described herein, and will be apparent from the following Detailed Description and the figures.

BRIEF DESCRIPTION OF THE FIGURES

FIGS. 7A to 7C are diagrams showing experiments of perpendicular magnetization for various materials of a spin barrier layer.

FIG. 8 is a diagram showing values of $K_U V/K_B T$ at room temperature in the experiments.

DETAILED DESCRIPTION

Hereinafter, an embodiment according to the present disclosure will be described in the following order.
1. Configuration of Storage Device according to Embodiment
2. Summary of Storage Element according to Embodiment
3. Specific Configuration of Embodiment
4. Experiment Relating to Embodiment 1. Configuration of Storage Device According to Embodiment First, the configuration of a storage device according to the embodiment of the present disclosure will be described.

Figure 1:
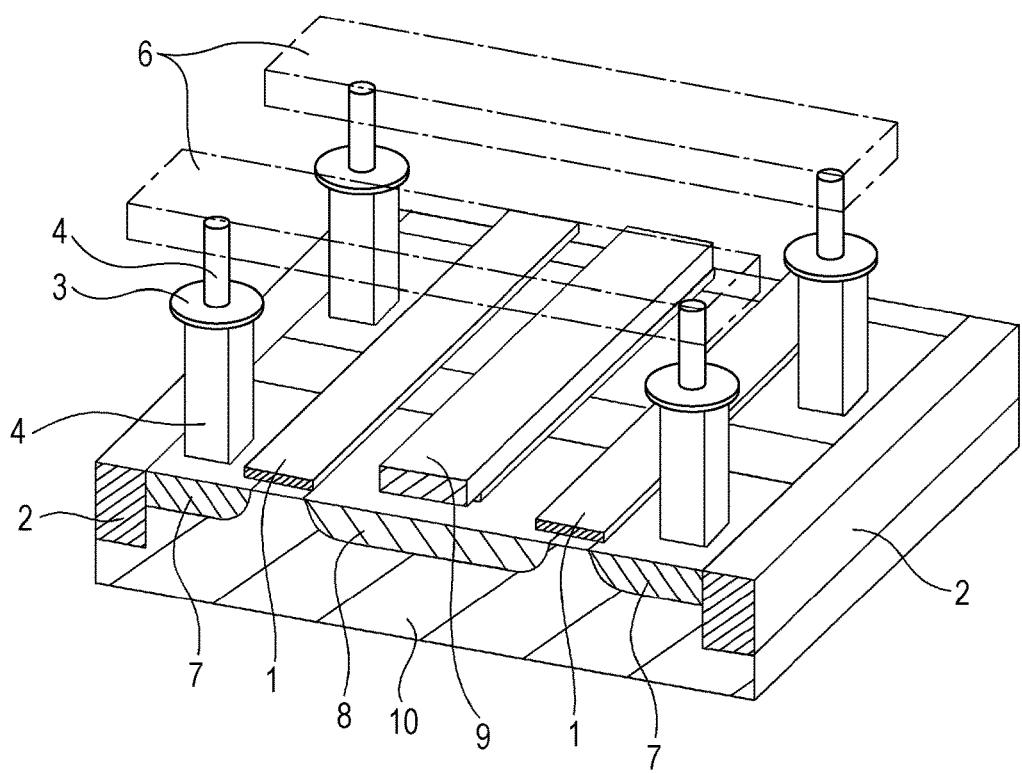
FIG. 1 is a perspective view schematically showing a configuration of a storage device according to an embodiment of the present disclosure.
Figure 2:
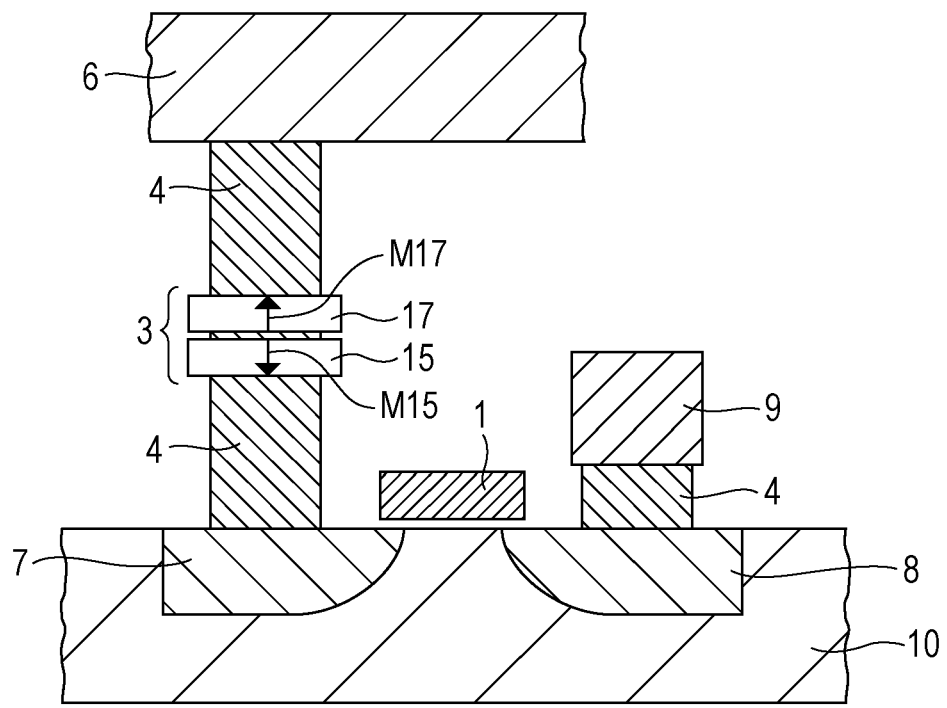
FIG. 2 is a cross-sectional view showing a storage device according to an embodiment of the present disclosure.

FIGS. 1 and 2 schematically show the storage device according to the embodiment. FIG. 1 is a perspective view and FIG. 2 is a cross-sectional view.

As shown in FIG. 1, in the storage device according to the embodiment, a storage element 3 which is configured by a ST-RAM and can store information on the basis of a magnetization state is disposed in the vicinity of the intersection of two types of address interconnects (for example, a word line and a bit line) intersecting with each other.

That is, a drain region 8, a source region 7, and a gate electrode 1 which configure a select transistor for selecting each storage device are respectively formed in a portion, which is isolated by an element isolation layer 2, of a semiconductor substrate 10 such as a silicon substrate. Among these, the gate electrode 1 overlaps one of the address interconnects (word line) which extends in the front-back direction of the drawing.

The drain region 8 is formed to be shared by the select transistors in the left and right sections of FIG. 1. An interconnect 9 is connected to the drain region 8.

In addition, the storage element 3 including a storage layer where a magnetization direction is reversed by a spin torque magnetization reversal is disposed between the source region 7 and the bit line 6 which is disposed above and extends in the left-right direction of FIG. 1. The storage element 3 includes a magnetic tunnel junction (MTJ) element, for example.

As shown in FIG. 2, the storage element 3 includes two magnetic layers 15 and 17. One of the two magnetic layers 15 and 17 is set as a fixed magnetization layer 15 where a direction of a magnetization M15 is fixed and the other magnetic layer is set as a free magnetic layer where a direction of a magnetization M17 changes, that is, a storage layer 17. In addition, the storage element 3 is connected to the bit line 6 and the source region 7 through upper and lower contact layers 4.

Accordingly, a current is made to flow in the storage element 3 in the vertical direction through the two types of address interconnects 1 and 6 and the direction of the magnetization M17 of the storage layer 17 can be reversed by the spin torque magnetization reversal.

In such a storage device, it is necessary to perform writing with a current equal to or less than a saturation current of the select transistor, and the saturation current of the transistor is reduced along with miniaturization of the storage device. Therefore, for the miniaturization, it is preferable to improve an efficiency of a spin transfer and reduce the current made to flow in the storage element 3.

In addition, in order to amplify a read signal, it is necessary to secure a large magnetoresistance change rate. To that end, it is effective to employ the above-described MTJ structure, that is, to configure the storage element 3 where a tunnel insulation layer (tunnel barrier layer) as the interlayer is interposed between the two layers of magnetic layers 15 and 17.

In this way, when the tunnel insulation layer is used as the interlayer, the amount of a current made to flow in the storage element 3 is limited in order to prevent the tunnel insulation layer from being broken down. That is, it is preferable that a current necessary for the spin torque magnetization reversal be limited from the viewpoint of securing the reliability for repetitive writing of the storage element 3. Here, the current necessary for the spin torque magnetization reversal may be sometimes referred to as a reversal current, a record current, or the like.

In addition, since the storage device is a nonvolatile memory, it is necessary to stably store information written by the current. That is, it is necessary to secure the stability (thermal stability) for thermal fluctuation of the magnetization of the storage layer.

When the thermal stability of the storage layer is not secured, the reversed direction of the magnetization may be reversed again by heat (temperature under the operation environment), thereby generating write error.

As compared to MRAM in the related art, the storage element 3 (ST-MRAM) in the storage device according to the embodiment has an advantageous effect in scaling. That is, the volume can be reduced. However, the reduction in volume may lead to the deterioration of the thermal stability if the other characteristics are the same.

When the capacity of ST-MRAM is increased, the volume of the storage element 3 is further reduced. Therefore, securing the thermal stability is an important issue.

Therefore, the thermal stability is a significantly important characteristic for the storage element 3 in the ST-MRAM, and it is necessary to design the storage element which can secure the thermal stability even when the volume is reduced.

2. Summary of Storage Element According to Embodiment

Next, the summary of the storage element according to the embodiment of the present disclosure will be described.

The storage element according to the embodiment is configured as ST-MRAM. The ST-MRAM reverses the direction of the magnetization of the storage layer of the storage element using the spin torque magnetization reversal, thereby storing information.

The storage layer is formed of a magnetic material containing a ferromagnetic layer and stores information on the basis of the magnetization state of the magnetic material (direction of the magnetization).

For example, the storage element 3 according to the embodiment, which will be described in detail below, has a layer structure as shown in FIG. 3, and includes at least two ferromagnetic layers of the storage layer 17, the fixed magnetization layer 15, and the interlayer 16 interposed between the two magnetic layers.

The storage layer 17 has the magnetization perpendicular to the layer surface, and the direction of the magnetization is changed in response to information.

The fixed magnetization layer 15 has the magnetization which is perpendicular to the layer surface and serves as a reference of the information written in the storage layer 17.

The interlayer 16 is an insulation layer formed of a nonmagnetic material and disposed between the storage layer 17 and the fixed magnetization layer 15.

In addition, by injecting electrons which are spin-polarized in a lamination direction of the layer structure including the storage layer 17, the interlayer 16, and the fixed magnetization layer 15, the direction of the magnetization of the storage layer 17 is changed and information is recorded on the storage layer 17.

Here, spin torque magnetization reversal will be described in brief.

Electrons have two types of spin angular momentums. For convenience, these are defined as upward and downward momentums. The numbers of both are the same in nonmagnetic materials but different in ferromagnetic materials. In the fixed magnetization layer 15 and the storage layer 17 as the two layers of ferromagnetic materials configuring the storage element 3, it is assumed that the electrons are moved from the fixed magnetization layer 15 to the storage layer 17 in a state the directions of the magnetic moments are opposite.

The fixed magnetization layer 15 is a fixed magnetic layer where the direction of the magnetic moment is fixed for high coercive force.

The electrons which have passed through the fixed magnetization layer 15 are spin-polarized. That is, a difference is generated between the numbers of the upward and downward electrons. When the thickness of the interlayer 16 as the nonmagnetic layer is sufficiently thin, the spin polarization can be alleviated by the electrons passing through the fixed magnetization layer 15. The electrons reach the other magnetic material, that is, the storage layer 17, before an unpolarized state (the numbers of the upward and downward electrons are the same) in the normal nonmagnetic material.

In the storage layer 17, the sign of the spin polarization is reversed. Therefore, in order to reduce the energy of the system, a number of electrons are reversed, that is, the direction of the spin angular momentum is changed. At this time, since the total angular momentum of the system should be conserved, the reaction, which is equivalent to the sum total of angular momentum changes of the direction-changed electrons, is applied to the magnetic moment of the storage layer 17.

When the current is low, that is, when the number of electrons passed within a unit time is small, the total number of the direction-changed electrons is also small. Therefore, the angular momentum changes generated by the magnetic moment of the storage layer 17 are also small. However, when the current is high, most of the angular moment changes can be applied within the unit time.

The temporal change of the angular momentum is torque. When the torque exceeds a given threshold, the magnetic moment of the storage layer 17 starts precession and rotates by 180° due to the uniaxial anisotropy thereof to become stable. That is, the magnetic moment is reversed from the opposite direction state to the same direction state.

When the magnetization is in the same direction state, the current is made to flow in a direction moving the electrons from the storage layer 17 to the fixed magnetization layer 15.

In this case, when the electrons, which are spin-reversed when being reflected in the fixed magnetization layer 15, enter in the storage layer 17, a torque is applied thereto. As a result, the magnetic moment can be reversed to the opposite direction. At this time, the amount of current necessary for the reversal is larger than the case of being reversed from the opposite direction state to the same direction state.

It is difficult to instinctively understand the reversal of the magnetic moment from the same direction to the opposite direction. However, it may be understood as follows: the magnetic moment is difficult to reverse because the fixed magnetization layer 15 is fixed; and the storage layer 17 is reversed in order to conserve the total angular momentum of the system. In this way, 0 and 1 are recorded by causing to flow the current, which is equal to, or more than, the given threshold and corresponds to the respective polarities, in the direction from the fixed magnetization layer 15 to the storage layer 17 or in the opposite direction thereof.

Similar to a case in MRAM in the related art, information is read using the magnetoresistance effect. That is, similar to the case of the recording described above, a current is made to flow in the direction perpendicular to the layer surface. In addition, the reading is performed using a phenomenon that an impedance indicated by the element changes depending on whether the magnetic moment of the storage layer 17 has the same direction as or the opposite direction to the that of the fixed magnetization layer 15.

A material used as the interlayer 16 interposed between the fixed magnetization layer 15 and the storage layer 17 may be a metal or an insulating material. However, the insulating material as the interlayer can obtain a higher read signal (resistance change rate) and perform recording at a lower current. The element at this time is referred to as a Magnetic Tunnel Junction (MTJ).

A threshold Ic of a current, which is necessary when the direction of the magnetization of the magnetic layer is reversed by the spin torque magnetization reversal, varies depending whether a magnetization easy axis of the magnetic layer is in the in-plane direction or the perpendicular direction.

The storage element according to the embodiment is a perpendicular magnetization type. In the case of an in-plane magnetization type storage element in the related art, when the reversal current where the direction of the magnetization of the magnetic layer is reversed is represented by Ic_para and the magnetization is reversed from the same direction to the opposite direction (here, the same direction and the opposite direction represent the magnetization direction of the storage layer with reference to the magnetization direction of the fixed magnetization layer), the following expression is satisfied.

$$Ic\_para = (A \cdot \alpha \cdot Ms \cdot V/g(0)/P)(Hk+2\pi Ms)$$

When the magnetization is reversed from the opposite direction to the same direction, the following expression is satisfied.

$$Ic\_para = (A \cdot \alpha \cdot Ms \cdot V/g(\pi)/P)(Hk+2\pi Ms)$$

(Hereinafter, the above expressions will be referred to as Expressions (1).)

On the other hand, when the reversal current of the perpendicular magnetization type storage layer according to the embodiment is represented by Ic_perp and the magnetization is reversed from the same direction to the opposite direction, the following expression is satisfied.

$$Ic\_perp = (A \cdot \alpha \cdot Ms \cdot V/g(0)/P)(Hk-4\pi Ms)$$

When the magnetization is reversed from the opposite direction to the same direction, the following expression is satisfied.

$$Ic\_perp = -(A \cdot \alpha \cdot Ms \cdot V/g(\pi)/P)(Hk-4\pi Ms)$$

(Hereinafter, the above expressions will be referred to as Expressions (2).)

In these expressions, A represents a constant, $\alpha$ represents a damping constant, Ms represents a saturation magnetization, V represents an element volume, P represents a spin polarizability, g(0) and g($\pi$) respectively represent coefficients corresponding to efficiencies of transmitting the spin torques to the counter magnetic layer in the same direction and in the opposite direction, and Hk represents a magnetic anisotropy.

In each of the above-described expressions, when (Hk−4$\pi$Ms) in the case of the perpendicular magnetization type and (Hk+2$\pi$Ms) in the case of the in-plane magnetization type are compared, it can be understood that the perpendicular magnetization type is more fitted for reducing the record current.

According to the embodiment, the storage layer 3 includes the magnetic layer (storage layer 17) which can store information on the basis of the magnetization state and the fixed magnetization layer 15 where the direction of the magnetization is fixed.

In order to act as a memory, it is necessary to store written information. The capability of storing information is determined by a value of an index $\Delta$ ($=KV/k_B T$) of the thermal stability. The index $\Delta$ is expressed by the following Expression (3).

$$\Delta = K_U \cdot V/k_B \cdot T = Ms \cdot V \cdot Hk(1/2k_B \cdot T) \quad \text{Expression (3)}$$

In this expression, Hk: effective anisotropy field, $k_B$: Boltzmann constant, T: temperature, Ms: saturation magnetization amount, V: volume of storage layer 17, and $K_U$: anisotropy energy.

The effective anisotropy field Hk includes shape magnetic anisotropy, induced magnetic anisotropy, and crystal magnetic anisotropy. When a single-domain coherent rotation mode is assumed, the effective anisotropy field is equal to the coercive force.

The index $\Delta$ of the thermal stability has a trade-off relationship with the threshold Ic of current in many cases. Therefore, in order to maintain memory characteristics, the trade-off therebetween becomes an issue in many cases.

When the thickness of the storage layer 17 is 2 nm and a TMR element with a plane pattern of 100 nm×150 nm has a substantially elliptical shape, for example, the threshold of the current which changes the magnetization state of the storage layer 17 are actually as follows.

Threshold On+Side+Ic=+0.5 mA

Threshold On−Side−Ic=−0.3 mA

The current density at this time is about $3.5 \times 10^6$ A/cm$^2$. These are almost equal to the above-described Expressions (1).

On the other hand, in normal MRAM where the magnetization is reversed by the current magnetic field, a write current of several tens of mA or more is necessary.

Therefore, it can be seen that ST-MRAM is effective for reducing the power consumption of an integrated circuit because the threshold of the write current is sufficiently low as described above.

In addition, since an interconnect for generating the current magnetic field which is necessary for normal MRAM is unnecessary, ST-MRAM is effective even in terms of integration, as compared to normal MRAM.

In addition, when the spin torque magnetization reversal is performed, a direct current is made to flow in the storage element 3 to write (record) information. Accordingly, in order to select the storage element 3 which performs the writing, the storage device is configured to connect the storage element 3 to the select transistor.

In this case, the current made to flow in the storage element 3 is limited to a magnitude of the current which can be made to flow in the select transistor (saturation current of the select transistor).

In order to reduce the record current, it is desirable to employ the perpendicular magnetization type as described above. In addition, since a perpendicular magnetic layer can secure a higher magnetic anisotropy than that of an in-plane magnetic layer in general, the perpendicular magnetic layer is preferable from the viewpoint of securing a large value of the above-described index $\Delta$ of the thermal stability.

Various kinds of magnetic material having perpendicular anisotropy are used, such as a rare earth-transition metal alloy (for example, TbCoFe), a metal multilayer (for example, Co/Pd multilayer), an ordered alloy (for example, FePt), or a material using interfacial anisotropy between an oxide and a magnetic metal (for example, Co/MgO). However, the rare earth-transition metal alloy loses the perpendicular magnetic anisotropy when being diffused and crystallized by heating, which is not preferable as the material of the ST-MRAM. Similarly, in the case of the metal multilayer, the perpendicular magnetic anisotropy deteriorates when being diffused by heating and the perpendicular magnetic anisotropy is developed in a (111) oriented face-centered cubic lattice. Therefore, it is difficult to realize the (001) orientation necessary for a high polarizability layer such as MgO; or Fe, CoFe, and CoFeB disposed adjacent to MgO. Since an L10 ordered alloy is stable even at a high temperature and the perpendicular magnetic anisotropy is developed in the (001) orientation, the above-described problem does not occur. However, it is necessary to perform ordering of atoms by performing heating at 500° C. or more during manufacture or by performing heat treatment at a high temperature of 500° C. or more after manufacture. Therefore, there is a possibility that an unfavorable diffusion or an increase in interface roughness may be caused in the other portion of laminated layers such as a tunnel barrier.

On the other hand, a layer where a Co-based or Fe-based material is laminated on a material using the interface magnetic anisotropy, that is, on MgO as the tunnel barrier, is not likely to have the above-described problems and thus highly expected as the material of the storage layer for the ST-MRAM.

Furthermore, when considering the saturation current value of the select transistor, the magnetic tunnel junction (MTJ) element is configured using the tunnel insulation layer formed of the insulating material as the nonmagnetic interlayer 16 interposed between the storage layer 17 and the fixed magnetization layer 15.

When the magnetic tunnel junction (MTJ) element is configured using the tunnel insulation layer, the magnetoresistance change rate (MR ratio) can be increased and the intensity of the read signal can be increased, as compared to a case of configured a giant magnetoresistance (GMR) element using a nonmagnetic conductive layer.

In particular, the magnetoresistance change rate (MR ratio) can be increased by using magnesium oxide (MgO) as the material of the interlayer 16 as the tunnel insulation layer.

In addition, generally, the efficiency of the spin transfer depends on the MR ratio. The larger MR ratio can improve the efficiency of the spin transfer and reduce the current density of the magnetization reversal.

Therefore, by using magnesium oxide as the material of the tunnel insulation layer and using the above-described storage layer 17 at the same time, the current threshold when writing is performed using the spin torque magnetization reversal can be reduced and information can be written (recorded) at a low current. In addition, the intensity of the read signal can be increased.

As a result, the MR ratio (TMR ratio) can be secured, the current threshold when writing is performed using the spin torque magnetization reversal can be reduced, and information can be written (stored) at a low current. In addition, the intensity of the read signal can be increased.

When the tunnel insulation layer is the magnesium oxide (MgO) layer, it is preferable that the MgO layer be crystallized and the crystal orientation be maintained in the 001 orientation.

It is necessary that the area resistance value of the tunnel insulation layer be controlled to be equal to less than several $\Omega\mu m^2$, from the viewpoint of obtaining the current density necessary for reversing the direction of the magnetization of the storage layer 17 using the spin torque magnetization reversal.

In addition, in order to control the area resistance value in the above-described range, it is necessary that the thickness of the tunnel insulation layer formed of MgO be set to be equal to or less than 1.5 nm.

In addition, in order for the direction of the magnetization of the storage layer 17 to be easily reversed at a low current, it is preferable to reduce the storage element 3 in size.

Therefore, preferably, the area of the storage element 3 is equal to or less than 0.01 $\mu m^2$.

3. Specific Configuration of Embodiment

Next, the specific configuration of the embodiment according to the present disclosure will be described.

In the configuration of the storage device, as described above with reference to FIG. 1, the storage element 3 which can store information on the basis of the magnetization state is disposed in the vicinity of the intersection of the two types of address interconnects 1 and 6 (for example, word line and bit line) intersecting with each other.

In addition, a current is made to flow in the storage element 3 in the vertical direction through the two types of address interconnects 1 and 6 and thus the direction of the magnetization of the storage layer 17 can be reversed by the spin torque magnetization reversal.

Figure 3A:
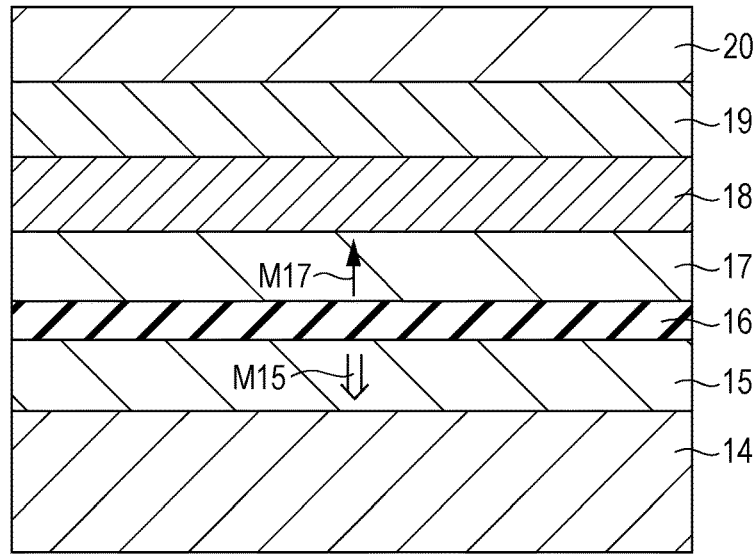
FIGS. 3A and 3B are cross-sectional views showing layer structures of a storage element according to an embodiment of the present disclosure.
Figure 3B:
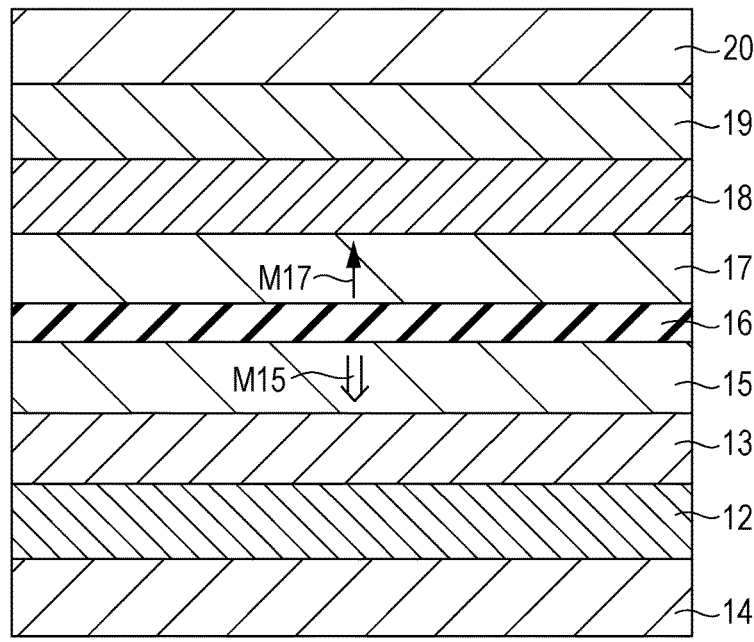

FIGS. 3A and 3B show examples of a layer structure of a storage device 3 (ST-MRAM) according to the embodiment.

In the example of FIG. 3A, the storage element 3 includes a ground layer 14, the fixed magnetization layer 15, the interlayer 16, the storage layer 17, a coercive force enhancement layer 18, a spin barrier layer 19, and a protective layer 20.

In the example of FIG. 3B, in addition to the layer structure of FIG. 3A, in order to increase the coercive force of the fixed magnetization layer 15, a magnetic coupling layer 13 and a high coercive force layer 12 are formed between the fixed magnetization layer 15 and the ground layer 14.

As shown in the respective examples of FIGS. 3A and 3B, in the storage element 3, the fixed magnetization layer 15 is disposed below the storage layer 17 where the direction of the magnetization M17 is reversed by the spin torque magnetization reversal.

In ST-MRAM, 0 and 1 of the information are defined by a relative angle between the magnetization M17 of the storage layer 17 and the magnetization M15 of the fixed magnetization layer 15.

The interlayer 16 as the tunnel barrier layer (tunnel insulation layer) is provided between the storage layer 17 and the fixed magnetization layer 15. The MTJ element is configured by the storage layer 17 and the fixed magnetization layer 15.

The storage layer 17 and the fixed magnetization layer 15 have the magnetization perpendicular the respective layer surface.

In addition, the ground layer 14 is formed below the fixed magnetization layer 15.

The coercive force enhancement layer 18 is formed above the storage layer 17 (that is, opposite to the interlayer 16 when seen from the storage layer 17).

Furthermore, the spin barrier layer 19 is formed above the coercive force enhancement layer 18 (that is, opposite to the storage layer 17 when seen from the coercive force enhancement layer 18).

The protective layer 20 is formed above the spin barrier layer 19.

According to the embodiment, the storage layer 17 and the fixed magnetization layer 15 are preferably formed of an alloy having at least one of Fe, Co, and Ni as a main component and containing at least one of B and C. The content of B and C is preferably 5% by atom to 30% by atom.

For example, a Fe-containing alloy such as FeCoB or FeNiC is suitable for the storage layer 17 and the fixed magnetization layer 15.

The storage layer 17 and the fixed magnetization layer 15 preferably contain at least 30% or more of Fe in the vicinity of the interface with the interlayer 16, respectively. When the content of Fe is less than 30%, it is difficult to obtain a sufficient perpendicular magnetic anisotropy.

For example, the interlayer 16 (tunnel barrier layer) is formed of MgO. In the case of the MgO (magnesium oxide) layer, the magnetoresistance change rate (MR ratio) can be increased. By increasing the MR ratio in this way, the efficiency of spin injection can be increased and the current density necessary for reversing the direction of the magnetization M17 of the storage layer 17 can be reduced.

In addition, the interlayer 16 can be formed of, in addition to magnesium oxide, $Al_2O_3$, $Al_2MgO_4$, TiO or the like.

The coercive force enhancement layer 18 can be formed of any one of Cr, Ru, Si, W, and Mn.

The spin barrier 19 can be formed of any one of magnesium oxide, chrome oxide, barium oxide, aluminum oxide, and calcium oxide.

The ground layer 14 and the protective layer 20 can be formed of various metals such as Ta, Ti, W, and Ru; and a conductive nitride such as TiN. In addition, the ground layer 14 and the protective layer 20 may be a single layer or may be formed by laminating plural layers formed of different materials.

The high coercive force layer 12 shown in FIG. 3B can be formed of CoPt, FePt, MnAl, and TbFeCo, and be a layer in which Co and Pt are laminated or a layer in which Co and Pd are laminated.

The magnetic coupling layer 13 can be formed of Ru, Re, Os, and the like.

In the storage element 3 according to the embodiment, the layers from the ground layer 14 to the protective layer 20 are sequentially and continuously formed in vacuum equipment. Thereafter, a pattern of the storage element 3 is formed by a process such as etching. As a result, the storage element can be manufactured.

As described above, for high density, the storage element should have large anisotropy energy with respect to thermal fluctuation. In order to increase the anisotropy energy, it is effective to increase coercive force and increase the thickness of the storage layer.

However, the interface anisotropy for obtaining a favorable perpendicular magnetization can be obtained only at the interface between the magnetic material and the oxide. Therefore, when the thickness of the magnetic layer is increased, the coercive force is reduced. As a result, it is difficult to easily increase the anisotropy energy.

Therefore, according to the embodiment, a nonvolatile memory which has large anisotropy energy in spin torque MRAM and a sufficient resistance to the thermal fluctuation even when the element is reduced in size can be realized.

In addition to the interface magnetic anisotropy acting between the interlayer 16 and the storage layer 17, the oxide layer (spin barrier layer 19) is also formed on a surface, which is opposite to the interlayer 16 side, of the storage layer 17. As a result, both of the sides of the storage layers 17 can have the interface anisotropy and thereby the perpendicular magnetic anisotropy energy can be enhanced.

At this time, it can be seen that, when the coercive force enhancement layer 18 formed of at least one of Cr, Ru, W, Si, and Mn is interposed between the storage layer 17 and the spin barrier layer 19, the perpendicular magnetic anisotropy can be enhanced more effectively.

As the coercive force enhancement layer 18, a layer formed of at least one of Cr, Ru, W, Si, and Mn is effective, and the effective thickness thereof is equal to or more than 0.03 nm. When the thickness is less than 0.03 nm, the effect is low.

When the coercive force enhancement layer 18 is formed of Cr, the thickness thereof is preferably equal to or less than 0.3 nm.

When the coercive force enhancement layer 18 is formed of Ru, the thickness thereof is preferably equal to or less than 0.2 nm.

When the coercive force enhancement layer 18 is formed of W, Si, or Mn, the thickness thereof is preferably equal to or less than 0.1 nm.

When the thickness of the coercive force enhancement layer 18 is less than 0.03 nm or more than the respective thickness in the above-described cases, it is difficult to obtain the enhancement effect of the perpendicular magnetic anisotropy.

The spin barrier layer 19 can be formed of various oxides, but magnesium oxide, chrome oxide, barium oxide, aluminum oxide, and calcium oxide are preferable because they have an excellent coercive force enhancement effect. The spin barrier 19 can be formed an oxide which is sufficiently oxidized or an oxide in which oxygen is deficient.

Samples used in the embodiment can be prepared by sputtering, vacuum deposition, chemical vapor deposition (CVD), or the like. Furthermore, the spin barrier layer 19 (oxide layer) can be prepared by forming a metal layer and then oxidizing the metal with an oxygen plasma.

The magnetic memory (ST-MRAM) can be configured in the following method. After a CMOS logic circuit is formed on a silicon wafer to configure the above-described laminated layer on a lower electrode, the laminated layer is formed into an appropriate shape by reactive ion etching (RIE), ion milling, chemical etching, and the like. Furthermore, an upper electrode is formed and the layer is connected to the CMOS circuit so as to apply an appropriate voltage between the upper and lower electrodes. The shape of the element is arbitrary, but a circular shape is particularly preferable because the preparation is easy and the arrangement can be performed with high density.

In the perpendicular magnetic ST-MRAM according to the embodiment which includes the coercive force enhancement layer 18 and the spin barrier layer 19, an element which has sufficient magnetic anisotropy energy even when the element is reduced in size can be obtained. As a result, a nonvolatile memory which has an excellent capability of storing information with high density can be realized.

In addition, since the storage layer 17 of the storage element 3 is the perpendicular magnetic layer, the write current amount necessary for reversing the direction of the magnetization M17 of the storage layer 17 can be reduced. Therefore, the power consumption when the writing is performed on the storage layer 3 can be reduced.

Since the thermal stability as information storage capability can be secured, the storage element 3 which has well-balanced characteristics can be configured.

Accordingly, the operating margin of the storage element 3 can be sufficiently obtained without operation errors and thus the storage element 3 can be stably operated. That is, the storage device which can stably operate with high reliability can be realized.

In this way, the storage element 3 which has an excellent information storage capability and can stably operate with high reliability can be realized. As a result, the reliability of the storage device having the storage element 3 can be improved and the power consumption thereof can be reduced.

In addition, the storage device which has the storage element 3 shown in FIGS. 3A and 3B and the structure shown in FIG. 1 has an advantageous effect in that a general semiconductor MOS forming process can be applied when being manufactured.

Therefore, the memory according to the embodiment can be used as a general-purpose memory.

In addition, elements other than Co, Fe, Ni can be added to the storage layer 17 according to the embodiment of the present disclosure.

By the addition of different kinds of elements, the effects of improving heat-resistance and increasing the magnetoresistance effect due to the prevention of diffusion and the effects of increasing dielectric strength voltage due to flattening and the like can be obtained. Examples of the elements added in this case include B, C, N, O, F, Mg, Si, P, Ti, V, Cr, Mn, Ni, Cu, Ge, Nb, Mo, Ru, Rh, Pd, Ag, Ta, W, Ir, Pt, Au, Zr, Hf, Re, and Os; and alloys thereof.

In addition, in the storage layer 17 according to the embodiment of the present disclosure, other ferromagnetic layers having different compositions can be directly laminated. In addition, a ferromagnetic layer and a soft magnetic layer can be laminated or plural ferromagnetic layers can be laminated with a soft magnetic layer and a nonmagnetic layer interposed therebetween. In such a lamination structure, the effect according to the embodiment of the present disclosure can be obtained.

In particular, in a structure where the plural ferromagnetic layers are laminated with the nonmagnetic layer interposed therebetween, the intensity of the interaction between the ferromagnetic layers can be adjusted. Therefore, even when the size of the storage layer 3 is equal to or less than a submicron, the magnetic reversal current can be suppressed from increasing. In this case, examples of materials of the nonmagnetic layer include Ru, Os, Re, Ir, Au, Ag, Cu, Al, Bi, Si, B, C, Cr, Ta, Pd, Pt, Zr, Hf, W, Mo, and Nb; and alloys thereof.

It is preferable that the thickness of the fixed magnetization layer 15 and the storage layer 17 be respectively 0.5 nm to 30 nm.

The other configurations of the storage element 3 can be the same as existing configurations of the storage element 3 in the related art which stores information using the spin torque magnetization reversal.

The fixed magnetization layer 15 can have a configuration in which the direction of the magnetization is fixed by only the ferromagnetic layer or by the antiferromagnetic bonding between an antiferromagnetic layer and the ferromagnetic layer.

In addition, the fixed magnetization layer 15 can have a structure in which a single-layer ferromagnetic layer is formed or a ferromagnetic pinned structure in which the plural ferromagnetic layers are laminated with the nonmagnetic layer interposed therebetween.

Examples of materials of the ferromagnetic layer configuring the fixed magnetization layer 15 having the ferromagnetic pinned structure include Co, CoFe, and CoFeB. In addition, examples of materials of the nonmagnetic layer include Ru, Re, Ir, and Os.

Examples of materials of the antiferromagnetic layer include magnetic materials such as FeMn alloys, PtMn alloys, PtCrMn alloys, NiMn alloys, IrMn alloys, NiO, and $Fe_2O_3$.

In addition, by adding nonmagnetic elements such as Ag, Cu, Au, Al, Si, Bi, Ta, B, C, O, N, Pd, Pt, Zr, Hf, Ir, W, Mo, and Nb to these magnetic materials, the magnetic characteristics can be adjusted and various physical properties such as a crystal structure, a crystallinity, and a substance stability can be adjusted.

In addition, the layer structure of the storage element 3 does not have a problem when the storage layer 17 is disposed below the fixed magnetization layer 15.

4. Experiment Relating to Embodiment

Hereinafter, experiments which were performed in order to verify the effect of the storage element 3 according to the embodiment will be described.

Experiment 1

First, in order to verify the effect of the spin barrier layer 19, the storage layer 17 was formed directly above the ground layer 14, and the coercive force enhancement layer 18, the spin barrier layer 19 and the protective layer 20 are formed thereon to prepare the sample.

Figure 4:
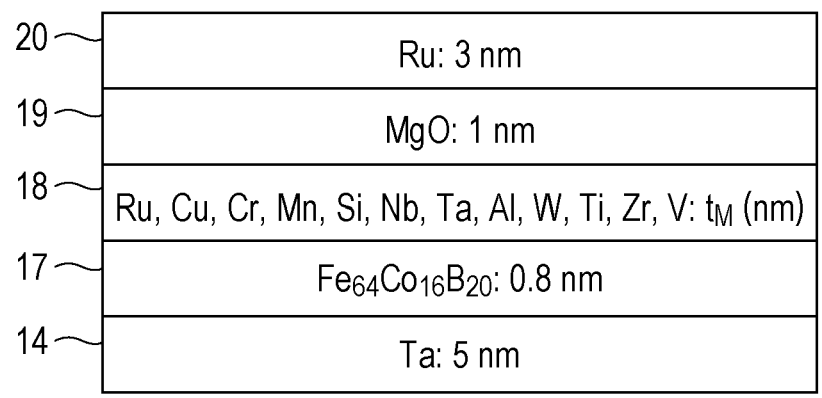
FIG. 4 is a diagram showing samples of experiments according to an embodiment of the present disclosure.

FIG. 4 shows the layer structure of the sample.

In the sample, as shown in FIG. 4, the respective layers were laminated on a silicon substrate with oxidation coating.
  Ground layer 14: a 5 nm-thick Ta layer
  Storage layer 17: a 0.8 nm-thick $Fe_{64}Co_{16}B_{20}$ layer
  Coercive force enhancement layer 18: a layer formed of respective elements with respective thicknesses $t_M$
  Spin barrier layer 19: a 1 nm-thick MgO layer
  Protective layer 20: a 3 nm-thick Ru layer
  As the coercive force enhancement layer 18, samples formed of respective materials of Ru, Cu, Cr, Mn, Si, Nb, Ta, Al, W, Ti, Zr, and V were prepared with respective thicknesses.

FIGS. 5A to 5D show the dependency of coercive forces Hc of the respective samples on the respective thicknesses $t_M$ of the respective elements used in the coercive force enhancement layer 18.

Figure 5A:
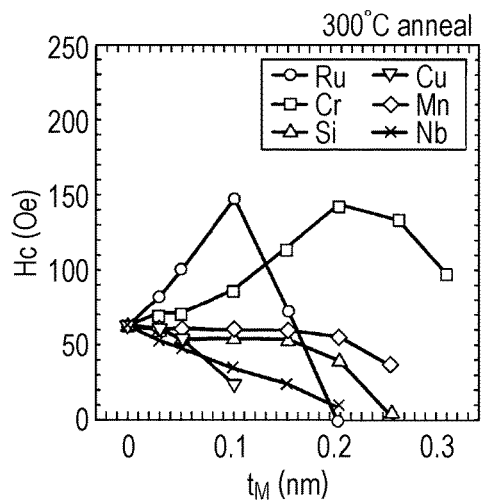
FIGS. 5A to 5D are diagrams showing the experiment results of the dependency of a coercive force Hc on coercive force enhancement layers of various samples and the thicknesses thereof.
Figure 5B:
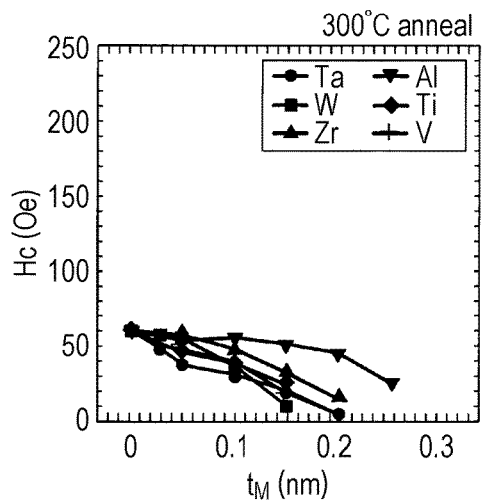
Figure 5C:
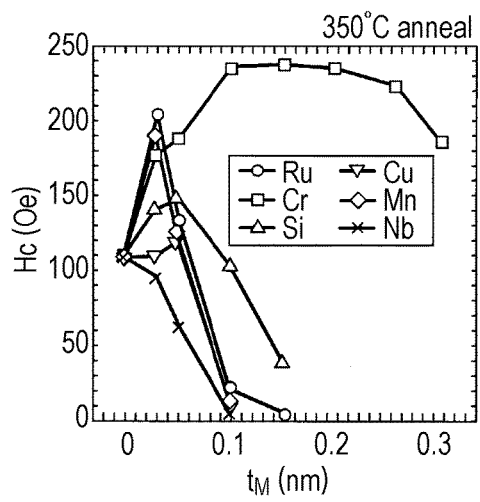
Figure 5D:
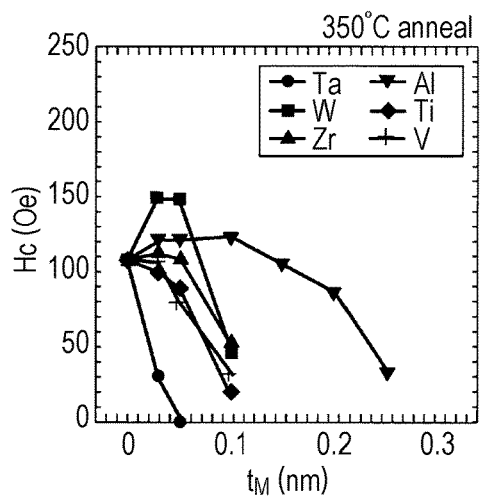

FIGS. 5A and 5B are the results after heat treatment at 300° C. for an hour, and FIGS. 5C and 5D are the results of after heat treatment at 350° C. for an hour.

Here, the thickness=0 represents the samples in which the coercive force enhancement layer 18 was not formed.

For example, in the case of Ru (sample in which the coercive force enhancement layer 18 was formed of Ru) in FIG. 5A, when the thicknesses $t_M$ are respectively 0.03 nm, 0.05 nm, 0.1 nm, and 0.15 nm, the coercive forces Hc were increased as compared to the case of the thickness=0, that is, as compared to the case where the coercive force enhancement layer 18 was not formed. Therefore, it can be seen that the coercive force enhancement layer 18 formed of Ru is effective for the coercive force enhancement in a given thickness range.

On the other hand, similarly, in the case of the coercive force enhancement layer 18 formed of Nb in FIG. 5A, the coercive forces Hc were reduced in all the cases of thicknesses, as compared to the case of the thickness=0, that is, as compared to the case where the coercive force enhancement layer 18 was not formed. The above results represent that Nb is not suitable for the coercive force enhancement layer 18.

When considering the results of the respective samples, as the coercive force enhancement layer 18, Ru and Cr have the coercive force enhancement effect in the case of the heat treatment of 300° C. and Ru, Cr, Mn, and Si have the coercive force enhancement effect in the case of the heat treatment of 350° C. When considering the results of the cases of the heat treatments of 300° C. and 350° C., the following thicknesses are preferable.

When the coercive force enhancement layer 18 is formed of Cr, the thickness is set to be 0.03 nm to 0.3 nm.

When the coercive force enhancement layer 18 is formed of Ru, the thickness is set to be 0.03 nm to 0.2 nm.

When the coercive force enhancement layer 18 is formed of any one of Si, W and Mn, the thickness is set to be 0.03 nm to 0.1 nm.

Experiment 2

Next, experiments of samples in which the fixed magnetization layer 15 was added as a configuration which is actually employed for a ferromagnetic tunnel element of a magnetic memory, were performed.

Figure 6A:
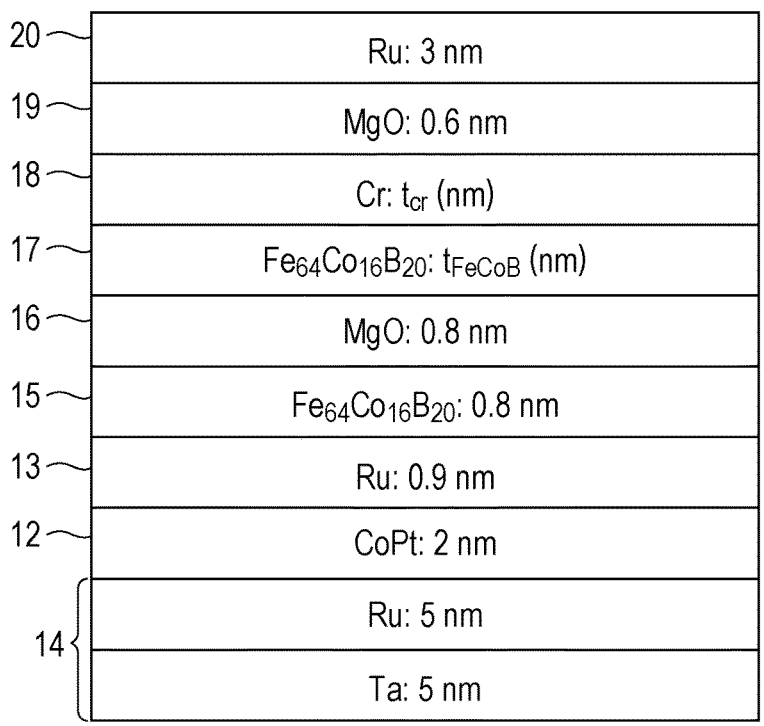
FIGS. 6A and 6B are diagrams showing the dependency of the magnitude of an anisotropy magnetic field on the thicknesses of the coercive force enhancement layer and a storage layer.
Figure 6B:
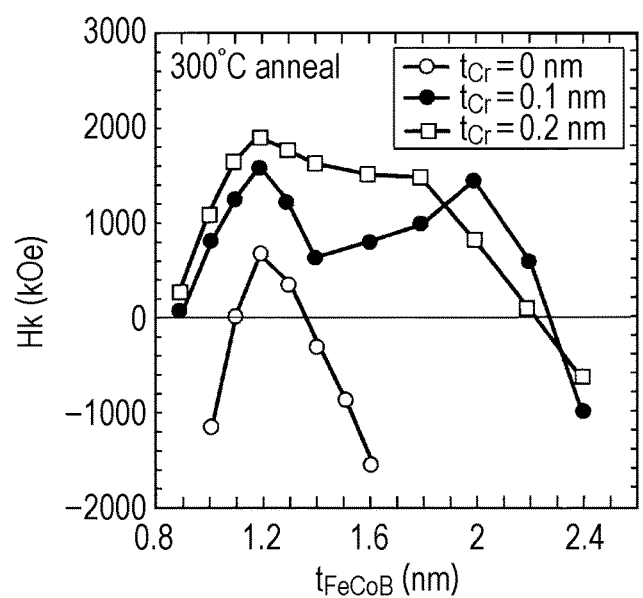

FIG. 6A shows the layer structures of the samples.
Ground layer 14: a 5 nm-thick Ta layer and a 5 nm-thick Ru layer
High coercive force layer 12: a 2 nm-thick CoPt layer
Magnetic coupling layer 13: a 0.9 nm-thick Ru layer
Fixed magnetization layer 15: a 0.8 nm-thick $Fe_{64}Co_{16}B_{20}$ layer
Interlayer 16: a 0.8 nm-thick MgO layer
Storage layer 17: a $t_{FeCoB}$-thick $Fe_{64}Co_{16}B_{20}$ layer
Coercive force enhancement layer 18: a $t_{Cr}$-thick Cr layer
Spin barrier layer 19: a 0.6 nm-thick MgO layer
Protective layer 20: a 3 nm-thick Ru layer The above-described samples were prepared, and the results of measuring perpendicular anisotropy magnetic fields ($H_K$) are shown in FIG. 6B.

Heat treatment was performed at 300° C. for an hour. Values of $H_K$ were obtained when demagnetizing field correction was not performed. The positive value of $H_K$ represents the perpendicular magnetic layer, and the negative value represents the in-plane magnetic layer.

In the case of $t_{Cr}$=0 nm where the Cr layer as the coercive force enhancement layer 18 was not interposed, the FeCoB storage layer 17 was the perpendicular magnetic layer only when the thickness $t_{FeCoB}$ was in a narrow thickness range of 1.1 nm to 1.3 nm. In addition, the $H_K$ was rapidly changed according to the layer thickness and the optimum condition was also in a narrow range.

On the other hand, in the case where the Cr layer as the coercive force enhancement layer 18 was interposed, the perpendicular magnetic anisotropy was increased in all the cases of $t_{Cr}$=0.1 nm and $t_{Cr}$=0.2 nm. In addition, the thickness $t_{FeCoB}$ of the FeCoB storage layer 17 where the perpendicular magnetization can be obtained is increased to be in a range of 0.9 nm to 2.2 nm and the perpendicular magnetic anisotropy was gradually changed according to the FeCoB layer thickness.

Experiment 3

Next, in order to examine the effect of the spin barrier layer 19, various oxides as the spin barrier layer were prepared on a storage magnetic layer in various preparation methods.

FIG. 7A shows the layer structure of the samples.
Ground layer 14: a 5 nm-thick Ta and a 5 nm-thick Ru layer
Storage layer 17: a 0.7 nm-thick $Fe_{40}Co_{40}C_{20}$ layer
Coercive force enhancement layer 18: a 0.2 nm-thick Cr layer
Spin barrier layer 19: a layer formed of each material
Protective layer 20: a 3 nm-thick Ru layer
Heat treatment was performed at 300° C. for an hour.

The spin barrier layer 19 was prepared so as to have a thickness of 0.7 nm in the case of RF sputtering or to have a thickness of 0.6 nm to 0.8 nm in the cases of natural oxidation and plasma oxidation.

FIGS. 7B and 7C respectively show materials capable of obtaining perpendicular magnetization and materials incapable of obtaining perpendicular magnetization, among the samples which are prepared with the respective materials of spin barrier layer 19 in the respective preparation methods. In the case of the materials capable of obtaining perpendicular magnetization (FIG. 7B), the coercive force (HCl) in the perpendicular direction is also shown.

The spin barrier layer 19 where perpendicular magnetization was obtained was formed of magnesium oxide, chrome oxide, barium oxide, aluminum oxide, or calcium oxide.

Experiment 4

Next, in order to examine the resistance to thermal fluctuation, a circular element having a diameter of 70 nm was formed, and an index $\Delta$ ($=K_U V/k_B T$) of the resistance to thermal fluctuation was examined (refer to Expression (3)).

The coercive force was repeatedly measured to evaluate the distribution thereof.

Sample A as a comparative example in which the coercive force enhancement layer 18 was not provided and samples B and C according to the embodiment in which the coercive force enhancement layer 18 were provided, were measured.

FIG. 8 shows the layer structures of Samples A, B, and C.

Sample A
Ground layer 14: a 5 nm-thick Ta layer and a 5 nm-thick Ru layer
High coercive force layer 12: a 2 nm-thick CoPt layer
Magnetic coupling layer 13: a 0.8 nm-thick Ru layer
Fixed magnetization layer 15: a 0.8 nm-thick $Fe_{64}Co_{16}B_{20}$ layer
Interlayer 16: a 0.8 nm-thick MgO layer
Storage layer 17: a 1.2 nm-thick $Fe_{64}Co_{16}B_{20}$ layer
Spin barrier layer 19: a 0.6 nm-thick MgO layer
Protective layer 20: a 3 nm-thick Ru layer Sample B
Ground layer 14: a 5 nm-thick Ta layer and a 5 nm-thick Ru layer
High coercive force layer 12: a 2 nm-thick CoPt layer
Magnetic coupling layer 13: a 0.8 nm-thick Ru layer
Fixed magnetization layer 15: a 0.8 nm-thick $Fe_{64}Co_{16}B_{20}$ layer
Interlayer 16: a 0.8 nm-thick MgO layer
Storage layer 17: a 1.6 nm-thick $Fe_{64}Co_{16}B_{20}$ layer
Coercive force enhancement layer 18: a 0.2 nm-thick Cr layer
Spin barrier layer 19: a 0.6 nm-thick MgO layer
Protective layer 20: a 3 nm-thick Ru layer Sample C
Ground layer 14: a 5 nm-thick Ta layer and a 5 nm-thick Ru layer
High coercive force layer 12: a 2 nm-thick CoPt layer
Magnetic coupling layer 13: a 0.8 nm-thick Ru layer
Fixed magnetization layer 15: a 0.8 nm-thick $Fe_{64}Co_{16}B_{20}$ layer
Interlayer 16: a 0.8 nm-thick MgO layer
Storage layer 17: a 1.5 nm-thick $Fe_{50}Ni_{30}C_{20}$ layer
Coercive force enhancement layer 18: a 0.05 nm-thick Ru layer.
Spin barrier layer 19: a 0.6 nm-thick CaO layer
Protective layer 20: a 3 nm-thick Ru layer Samples A and B were subjected to heat treatment at 300° C. for an hour. Samples C was subjected to heat treatment at 350° C. for an hour. In the lower section of FIG. 8, the values of $K_UV/k_BT$ of the respective samples at room temperature were shown.

Sample A (comparative example) was 35, Sample B was 76, and Sample C was 68.

In order to stores information for ten years or more, the value of $K_UV/k_BT$ should be equal to or more than 60. Therefore, it can be seen that the storage element according to the embodiment satisfies this condition and is effective as a nonvolatile memory element.

From the results of Experiments 1 to 4, it can be seen that, when a layer having the configuration according to the embodiment is used in the spin torque MRAM using the perpendicular magnetic layer, a high-density nonvolatile memory which has excellent coercive characteristics can be realized.

An embodiment according to the present disclosure can have the following configurations.

(1) A storage element including:
a storage layer that has a magnetization perpendicular to a surface of the layer and stores information on the basis of a magnetization state of a magnetic material;
a fixed magnetization layer that has the magnetization serving as a reference of the information stored in the storage layer and being perpendicular to the surface of the layer;
an interlayer that is formed of a nonmagnetic material and interposed between the storage layer and the fixed magnetization layer;
a coercive force enhancement layer that is provided to be adjacent to the storage layer and opposite to the interlayer and is formed of at least one of Cr, Ru, W, Si, and Mn; and
a spin barrier layer that is formed of an oxide and provided to be adjacent to the coercive force enhancement layer and opposite to the storage layer,
wherein the magnetization of the storage layer is reversed using a spin torque magnetization reversal which is caused by a current flowing in a lamination direction of a layer structure including the storage layer, the interlayer, and the fixed magnetization layer, thereby storing information.

(2) The storage element according to (1) described above,
wherein the storage layer contains at least one of Fe, Co, and Ni as a main component and contains at least one of B and C.

(3) The storage element according to (1) or (2) described above,
wherein the coercive force enhancement layer is formed of Cr and has a thickness of 0.03 nm to 0.3 nm.

(4) The storage element according to (1) or (2) described above,
wherein the coercive force enhancement layer is formed of Ru and has a thickness of 0.03 nm to 0.2 nm.

(5) The storage element according to (1) or (2) described above,
wherein the coercive force enhancement layer is formed of at least one of Si, W, and Mn and has a thickness of 0.03 nm to 0.1 nm.

(6) The storage element according to any one of (1) to (5) described above,
wherein the spin barrier layer is formed of at least one of magnesium oxide, chrome oxide, barium oxide, aluminum oxide, and calcium oxide.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
a storage layer having a magnetization state of a first magnetic material;
a fixed magnetization layer having a fixed magnetization state of a second magnetic material;
an interlayer including a nonmagnetic material and interposed between the storage layer and the fixed magnetization layer;
a coercive force enhancement layer adjacent to the storage layer and opposite to the interlayer, the coercive force enhancement layer includes Cr and has a thickness from 0.03 nm to 0.3 nm;
a spin barrier layer including an oxide, the spin barrier layer adjacent to the coercive force enhancement layer and opposite to the storage layer; and
a ground layer, a magnetic coupling layer, and a high coercive force layer, wherein the magnetic coupling layer and the high coercive force layer are positioned between the fixed magnetization layer and the ground layer, and the storage layer comprises at least 30% by atom of the first magnetic material, and the fixed magnetization layer comprises at least 30% by atom of the second magnetic material.

2. The storage element according to claim 1, wherein the storage layer includes a ferromagnetic material.

3. The storage element according to claim 2, wherein the ferromagnetic material includes Co, Fe, and B.

4. The storage element according to claim 1, wherein the storage layer includes at least one of Fe, Co, and Ni as a main component.

5. The storage element according to claim 1, wherein the spin barrier layer includes at least one of magnesium oxide, chromium oxide, barium oxide, aluminum oxide, and calcium oxide.

6. The storage element according to claim 1, wherein each of the storage layer and the fixed magnetization layer has a magnetization substantially perpendicular to a reference layer surface.

7. The storage element according to claim 6, wherein the reference layer surface is a top surface of at least one of the storage layer, the fixed magnetization layer, the coercive force enhancement layer and the spin barrier layer.

8. The storage element according to claim 1, wherein the fixed magnetization layer includes Co, Fe, and B.

9. The storage element according to claim 1, wherein the magnetization state of the first magnetic material is configured to be changed by a current.

10. The storage element according to claim 1, wherein the storage layer and the fixed magnetization layer each comprise an alloy comprising at least one of Fe, Co, and Ni as a main component and 5-30% by atom of at least one of B and C.

11. A storage device comprising:
a storage element that stores information associated with a magnetization state of a first magnetic material; and
two types of lines that intersect with each other,
wherein the storage element is interposed between the two types of lines, and the storage element includes
a storage layer having the magnetization state of the first magnetic material;
a fixed magnetization layer having a fixed magnetization state of a second magnetic material;
an interlayer including a nonmagnetic material and interposed between the storage layer and the fixed magnetization layer;
a coercive force enhancement layer adjacent to the storage layer and opposite to the interlayer, the coercive force enhancement layer includes Cr and has a thickness from 0.03 nm to 0.3 nm;
a spin barrier layer including an oxide, the spin barrier layer adjacent to the coercive force enhancement layer and opposite to the storage layer; and
a ground layer, a magnetic coupling layer, and a high coercive force layer, wherein the magnetic coupling layer and the high coercive force layer are positioned between the fixed magnetization layer and the ground layer, and the storage layer comprises at least 30% by atom of the first magnetic material, and the fixed magnetization layer comprises at least 30% by atom of the second magnetic material.

12. The storage device according to claim 11, wherein the storage layer includes a ferromagnetic material.

13. The storage device according to claim 12, wherein the ferromagnetic material includes Co, Fe, and B.

14. The storage device according to claim 11, wherein the storage layer includes at least one of Fe, Co, and Ni as a main component.

15. The storage device according to claim 11, wherein the spin barrier layer includes at least one of magnesium oxide, chromium oxide, barium oxide, aluminum oxide, and calcium oxide.

16. The storage device according to claim 11, wherein each of the storage layer and the fixed magnetization layer has a magnetization substantially perpendicular to a reference layer surface.

17. The storage device according to claim 16, wherein the reference layer surface is a top surface of at least one of the storage layer, the fixed magnetization layer, the coercive force enhancement layer and the spin barrier layer.

18. The storage device according to claim 11, wherein the fixed magnetization layer includes Co, Fe, and B.

19. The storage device according to claim 11, wherein the magnetization state of the first magnetic material is configured to be changed by a current.

* * * * *